United States Patent [19]
Harris et al.

[11] Patent Number: 5,934,485
[45] Date of Patent: Aug. 10, 1999

[54] TELECOMMUNICATIONS RACK

[75] Inventors: Mark R. Harris, Woodlawn; Adrianus Van Gaal, Kanata; Joseph Lommen, Nepean; Rand C. S. Cheesman, Dunrobin, all of Canada

[73] Assignee: Northern Telecom Limited, Montreal, Canada

[21] Appl. No.: 08/997,781

[22] Filed: Dec. 24, 1997

[51] Int. Cl.$^6$ ........................................ A47F 5/00
[52] U.S. Cl. ...................... 211/26; 211/189; 312/265.1; 361/829
[58] Field of Search .................. 211/26, 189, 181.1; 312/265.1, 265.3, 265.4; 361/825, 829

[56] References Cited

U.S. PATENT DOCUMENTS

| | | | |
|---|---|---|---|
| 4,641,225 | 2/1987 | Reichle | 361/429 |
| 4,715,502 | 12/1987 | Salmon | 211/26 |
| 5,228,762 | 7/1993 | Mascrier | 312/265.1 X |
| 5,284,254 | 2/1994 | Rinderer | 211/26 |
| 5,323,916 | 6/1994 | Salmon | 211/26 |
| 5,390,803 | 2/1995 | McAllister | 211/181.1 X |
| 5,499,481 | 3/1996 | Targetti | 211/189 X |
| 5,540,339 | 7/1996 | Lerman | 211/26 |
| 5,566,836 | 10/1996 | Lerman | 211/26 |
| 5,584,406 | 12/1996 | Besserer et al. | 211/189 |
| 5,683,001 | 11/1997 | Masuda et al. | 211/26 |
| 5,788,087 | 8/1998 | Orlando | 211/26 |

*Primary Examiner*—Robert W. Gibson, Jr.

[57] ABSTRACT

A telecommunications rack is provided to house telecommunications equipment, to conform to standards set by NEBS and ETSI, and provide the advantages of a lightweight rack while remaining stiff. This rack has two upright supports wherein each upright support has a truss member secured to vertical members. The truss configuration permits easier access to cabling and reduces the weight of the rack. The rack also incorporates a base with adjustable feet for improved levelling after the rack is installed. The base also may be pre-stressed, which is advantageous in locations that are susceptible to seismic occurrences to reduce the risk of damaging the telecommunications equipment during such occurrences.

13 Claims, 6 Drawing Sheets

TELECOMMUNICATIONS RACK

FIELD OF THE INVENTION

The present invention relates to a rack for supporting equipment and is particularly concerned with a rack for supporting telecommunications equipment.

BACKGROUND OF THE INVENTION

Telecommunications racks are used to support telecommunications equipment on floors of office buildings that are designed to bear these loads. These racks also permit cables to be installed and maintained while the equipment is in place.

In North America and Europe, standards or criteria are set for allowable dimensions for equipment in the telecommunications industry. The North American standards are known as NEBS standards (Network Equipment Building system) and the European standards are set by ETSI (European Telecommunications Standards Institute). The NEBS standards vary for buildings in different geographic locations, and telecommunications equipment must meet these specifications in order to be installed in the particular buildings. In earthquake sensitive areas, the NEBS standards also address design criteria under critical loading situations.

The design criteria stipulate, among other things, the maximum deflection of the top of the rack under seismic loading conditions. To meet these criteria, the rack should be relatively stiff. One difficulty with these designs is that racks gain weight in order to meet this stiffness requirement. The effect of this increased stiffness is that the natural frequency of the rack, which is calculated by dividing the stiffness of the rack by its weight, is reduced. A low value of natural frequency is a disadvantage since this increases the likelihood of catastrophic failure under seismic loading conditions.

Telecommunications racks are typically constructed with members which are made of various alloys of aluminum or steel. Various techniques are used to make these members, such as roll forming or extrusion, and the members are either welded or bolted together. The members of these racks typically have flat and solid surfaces, which do not allow cables to pass through the members. Creating openings in these members for cabling is undesirable since the openings will weaken or reduce the stiffness of the rack.

SUMMARY OF THE INVENTION

An object of the present invention is to provide an improved telecommunications rack, in which these disadvantages are obviated or mitigated.

In accordance with an aspect of the present invention, there is provided a telecommunications rack made of structural steel, comprising a base, a top, two spaced substantially upright supports extending between and secured to the base and the top, each support having a plurality of substantially vertical members, and a truss member disposed between at least two of the substantially vertical members and secured thereto.

In accordance with another aspect of the present invention, there is provided a telecommunications rack made of structural steel and comprising a base, a top and two open-structure sides extending between the base and the top, wherein each side comprises two spaced substantially vertical members extending between and secured to the base and the top, and an elongate truss member having a generally zig-zag configuration defining spaced crests, the truss member being located between the two spaced members, with its crests welded to the two spaced members, and extending between the base and the top.

The invention provides improved structural stiffness with a lightweight rack and improved access to the equipment for cabling. The rack design is also suitable for manufacturing to either ETSI or NEBS standards.

BRIEF DESCRIPTION OF DRAWINGS

The present invention will be further understood from the following description with references to the drawings in which.

DETAILED DESCRIPTION OF THE PREFERRED EMBODIMENT

Figure 1:
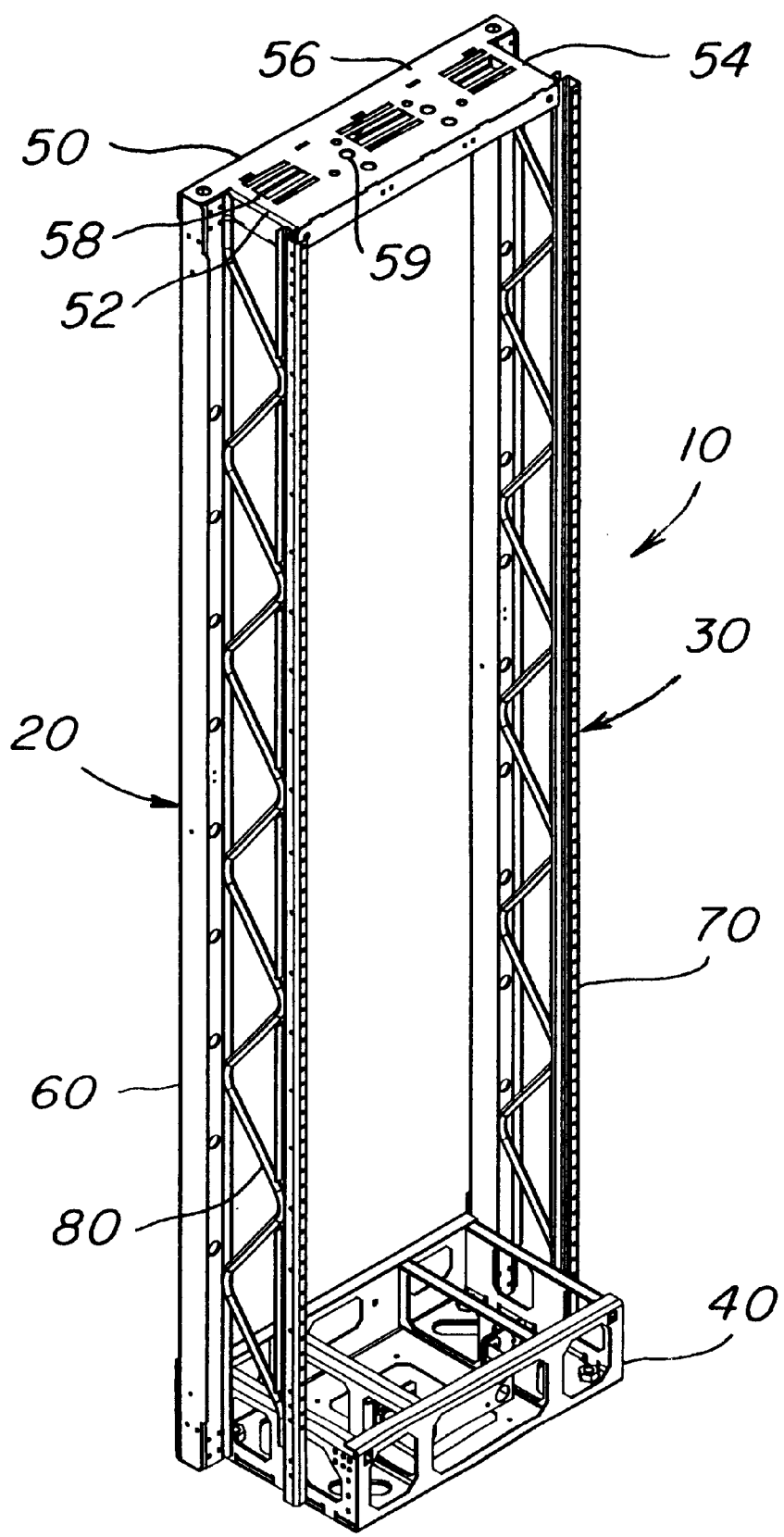
FIG. 1 is a perspective view of a telecommunications rack according to an embodiment of the invention.

Referring firstly to FIG. 1., a rectangular telecommunications rack according to an embodiment of the invention is generally indicated by 10 and consists of upright supports 20 and 30, a base 40 and a top 50.

The top 50 has two opposite ends, 52 and 54, which are each attached to upright supports 20 and 30 by welds, bolts or other fasteners. The top 50 has a generally rectangular surface 56 extending between the opposite ends 52 and 54. The surface 56 contains many openings 58, preferably in a slit shape, to permit air flow from the telecommunications equipment and to allow cable troughs (not shown) to be mounted, usually with bolts, to surface 56. Cable troughs are devices, typically made of steel, that are located above the racks and permit cabling to be connected from one bay of equipment to another. The surface 56 also has holes 59 with weld nuts (not shown) mounted to the interior of surface 56. Weld nuts are known nuts, hexagonal in shape, that are welded to the interior of surface 56. As a result of attaching weld nuts to the interior of surface 56, additional threads are available to attach supports for the cable troughs overhead. Alternatively, weld nuts permit the attachment of lifting hooks to surface 56. Lifting hooks, which are not shown, allow cables to be attached to the rack, which may be loaded with telecommunications equipment, to raise and manoeuvre the rack into position. Preferably, the top 50 is made of sheet steel that is 3 mm thick, and holes 59 are 13.5 mm in diameter.

Figure 2:
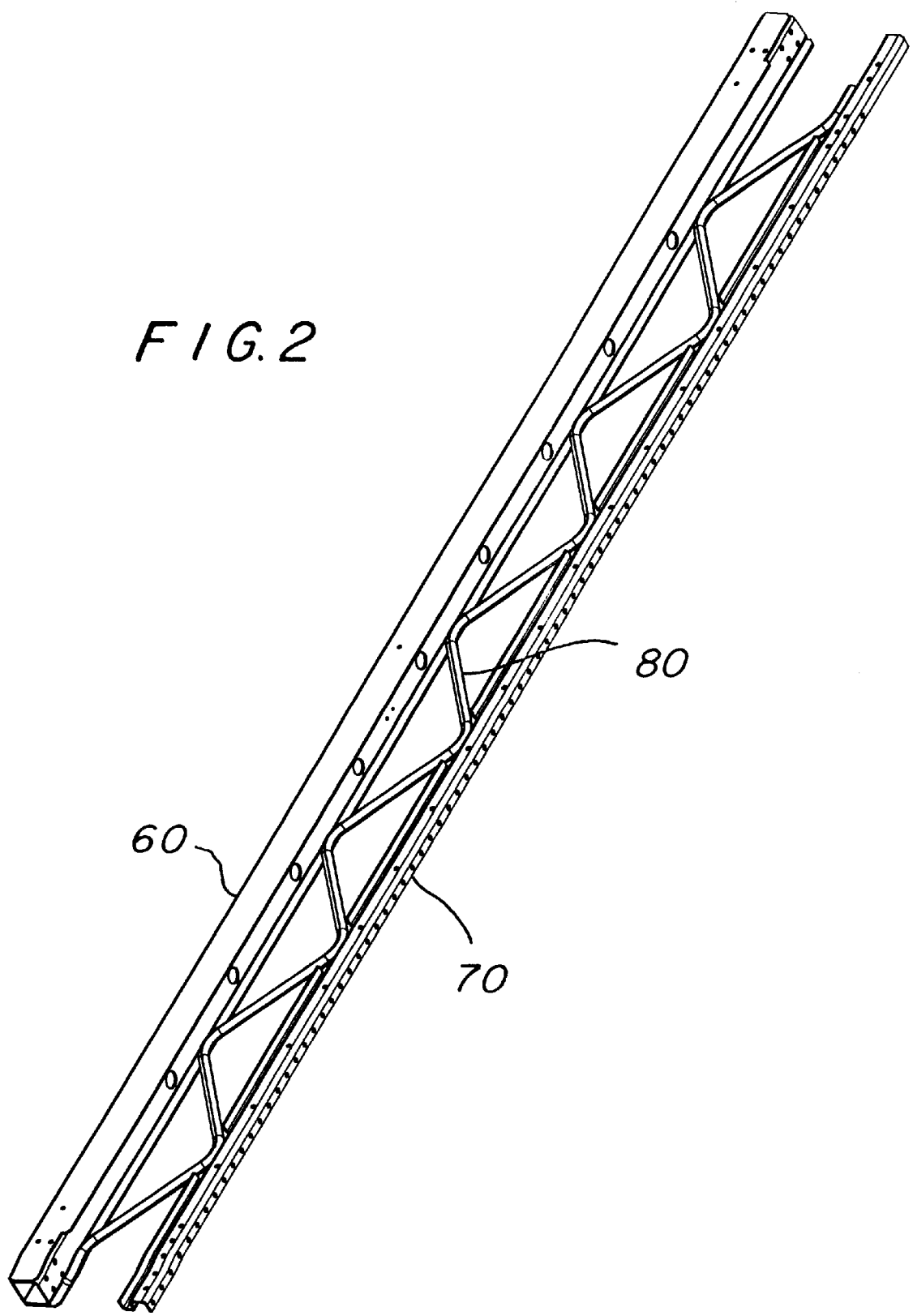
FIG. 2 is a perspective view of an upright support of the telecommunications rack of FIG. 1.
Figure 3:
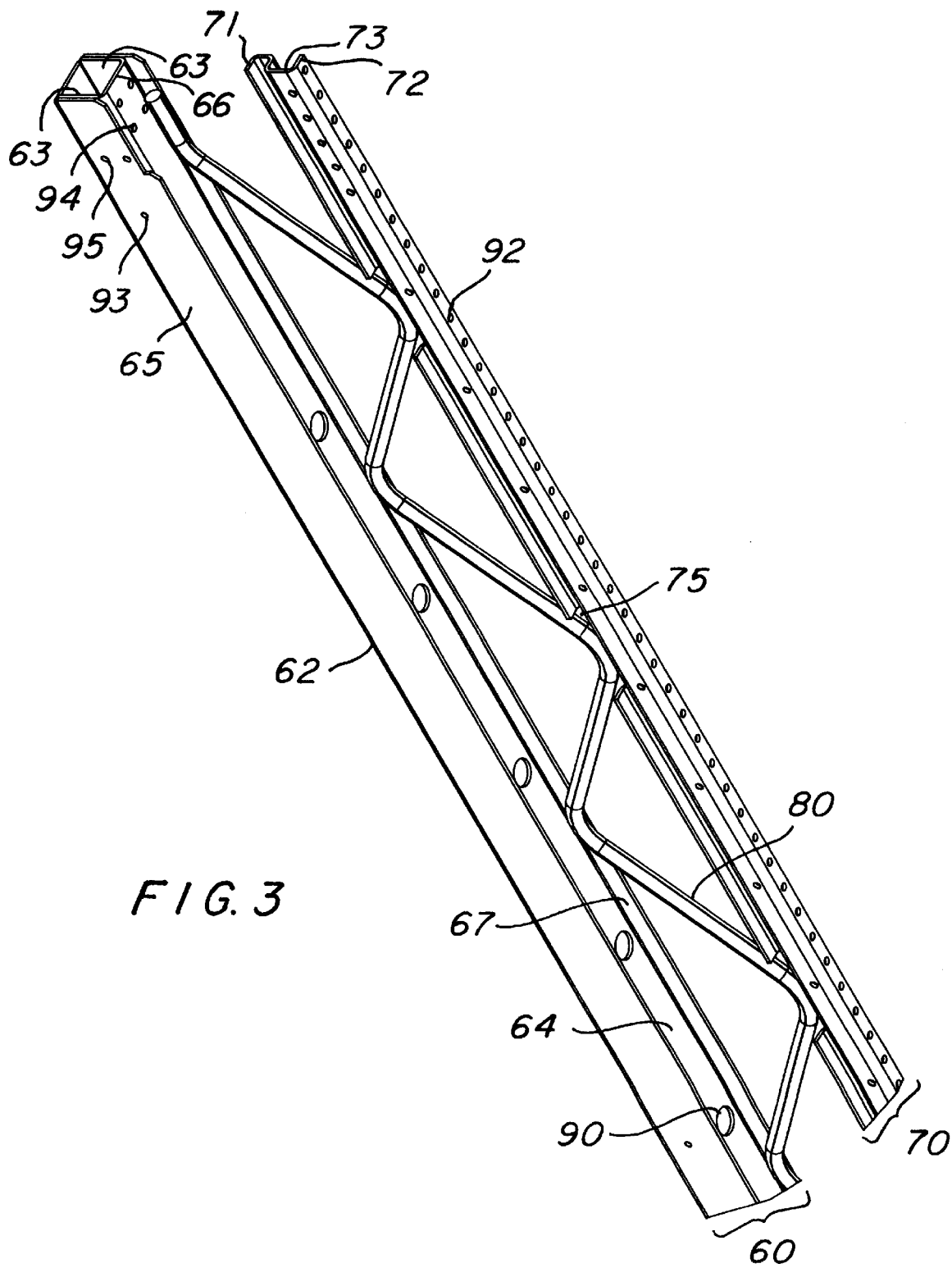
FIG. 3 is a perspective view, drawn to a larger scale, of a section of the upright support of FIG. 2.

Upright supports 20 and 30 each consist of two formed sheet steel members, 60 and 70, at the rear and front, respectively, with a cross member 80 joining rear member 60 to front member 70. As shown in FIGS. 2 and 3, rear member 60 and front member 70 are constructed with channel shaped sheet steel, and preferably, cross member 80 is made from formed wire which is approximately 12.7 mm in diameter.

As shown in FIG. 3, rear member 60 consists of two members, 62 and 64, each of which is C-shaped in cross-section. Members 62 and 64 oppose one another, and member 64 is sized to fit within member 62 to form a rectangular section. This design creates a lightweight structure with a high torsional stiffness and consequently a high natural frequency. The high natural frequency is advantageous in locations that are susceptible to seismic occurrences in order to maintain the integrity of the telecommunications equipment. Further, since rear members 60 are stiffer than front members 70, during a seismic occurrence, for example, rear members 60 bear most of the dynamic load.

Figure 6:
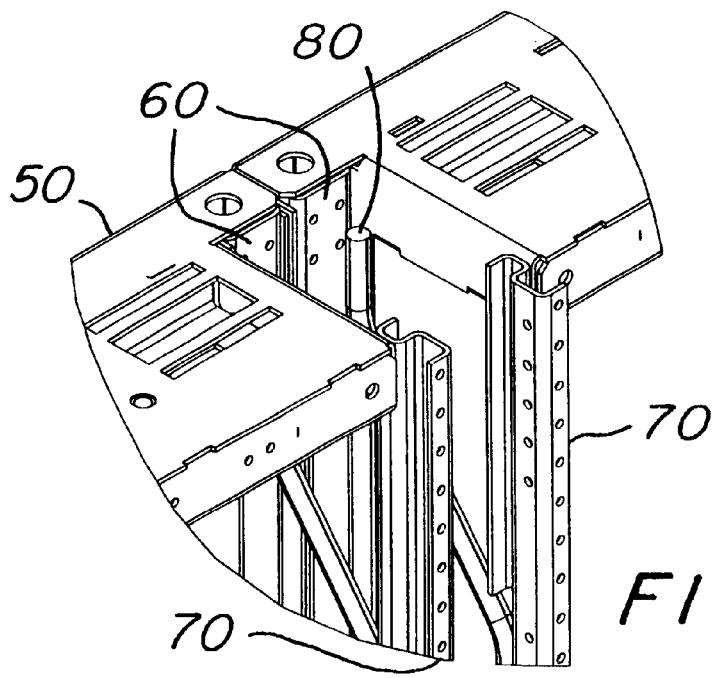
FIG. 6 is a perspective view of a portion of two adjacent telecommunications racks constructed according to the invention.
Figure 7:
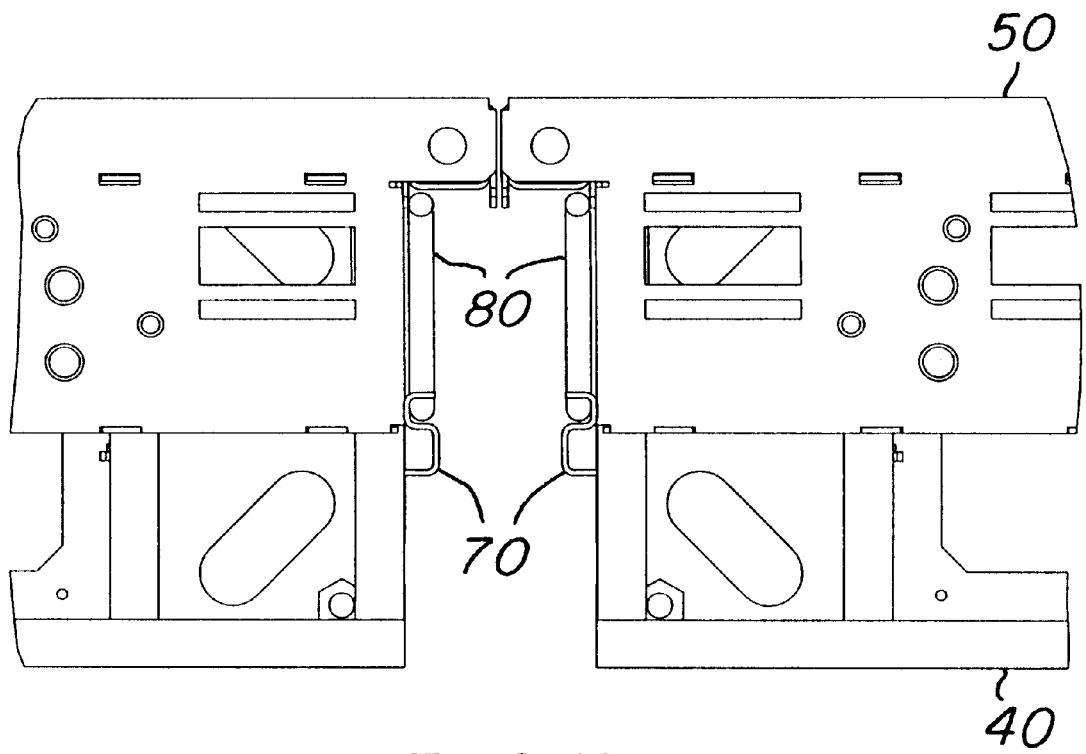
FIG. 7 is a top view of the portion shown in FIG. 6.

Member 64 comprises section 66 which faces the front of the rack, and two opposing side sections 63. Side sections 63 have a shorter depth than side sections 65 of the C-shaped member 62. Accordingly, as illustrated in FIG. 3, when the member 64 fits against the member 62, a free end portion 67 of each side section 65 extends beyond section 66. The resultant groove that is formed between portion 67 of one of the side sections 65 and section 66 permits welding opposing members 62 and 64 together, and also permits welding cross member 80 to member 60. Over a length of approximately 80 mm extending from both the top and the bottom of member 60, the side section 65 which is not welded to cross member 80 is approximately the same depth as side sections 63, thus eliminating portion 67 in these lengths. In these regions where portion 67 is eliminated, a junctioning plate (not shown) can be attached with bolts to section 66 and the junctioning plate will be flush against section 66 without interference from portion 67. A junctioning plate is a plate with holes that joins adjacent racks in a side-by-side configuration. In such an arrangement, the side sections 65 on the outside of the racks face one another. FIGS. 6 and 7 illustrate a side-by-side configuration.

Member 70 is S-shaped in cross-section and positioned opposite member 60, such that one section of the S-section, shown in FIG. 3 as section 71, faces section 66 of member 64.

Section 71 has various "cut-away" sections 75 which are preferably 80 mm long. At these locations, a sufficient gap exists in section 71 to accommodate cross member 80, described in detail below. Section 72 is another section of S-shaped member 70 that extends parallel to section 71 but is offset from section 71 and is seen when the rack is viewed from the front. Section 73 is another section of S-shaped member 70 that extends at a right angle to section 72 and is located between sections 72 and 71.

Sections 72 and 73 have many holes 92 throughout their lengths, which in a preferred embodiment are 5.5 mm in diameter. Holes 92 are spaced approximately 25 mm apart on section 72, and are used for mounting the shelves, which contain the telecommunications equipment, to the rack. Thread forming screws are used to attach the shelves to the rack.

On section 73, holes 92 are approximately 100 mm apart except in the region near the bottom and top. In these regions, from approximately 120 mm from the bottom and the top of section 73, the spacing between holes 92 is approximately 25 mm. On section 73, the holes 92 are used to attach accessories to the rack. Holes 92 have a closer spacing near the top and bottom since most accessories are installed in these regions. If an accessory needs to be installed at a certain location along the rest of section 73, the 100 mm spacing permits one to easily count the number of holes to ensure the accessory is mounted to both members 70 at the same location. Accessories are mounted with thread forming screws.

As illustrated in FIG. 1, the width between rear members 60 at the rear of the rack is greater than the width between front members 70 at the front of the rack. In light of this difference between widths, it is possible to access rear members 60 from the front of the rack. This can be seen in FIGS. 6 and 7, where two racks are shown in a side-by-side configuration. In this configuration, cabling may be attached to cross member 80 and there is adequate space for the cabling since a slot is created between adjacent front members 70 that extends to the rear of the rack.

Member 64 has many holes 90 throughout its length and located in section 66, which are clearance holes used to gain access to smaller diameter holes (not shown) in the rear of member 60. These holes at the rear of member 60 are used to bolt racks together in a back-to-back configuration. Alternatively, a rack may have a shear plate (not shown) attached to members 60. A shear plate is a solid steel plate which will close in the rear of the rack and provide further stiffness to the rack. In a preferred embodiment, holes 90 are 21 mm in diameter, and the smaller diameter holes are 9 mm.

As shown in FIG. 3, member 64 also has smaller holes 94 at either end of section 66, which are used for side to side junctioning of racks. The junctioning plate, described above, is attached to the rear member 60 through holes 94. In a preferred embodiment, holes 94 are 5.5 mm in diameter.

Member 62 contains three holes 93, one at either end and one in the middle of side sections 63, which are tooling holes used by the manufacturer to align members 62 and 63 during welding. Member 62 also contains two holes 95 located approximately 70 mm from the top and bottom which may be used to attach accessories such as side panels or end of aisle panels. In a preferred embodiment, holes 95 are 5.5 mm in diameter.

In a preferred embodiment, as shown in FIGS. 2 and 3, cross member 80 is made of formed wire and is welded to members 60 and 70 at a plurality of locations. Formed wire is attached at either end of member 60 by welding one end of wire 80 to section 66 and the portion 67 of side section 65 that extends beyond section 66. This configuration is shown in FIG. 3.

Cross member 80 extends along members 60 and 70 in a wave shaped or "zig-zag" pattern, such that cross member 80 is welded along the structure 60 at locations that are generally between the locations where it is welded along the structure 70. This welding pattern with members 60, 70 and cross member 80 creates a truss-like shape with cross member 80 forming crests at the locations where it is welded to members 60 and 70. The crests are welded to the S-shaped member 70 at locations 75 where section 71 is "cut-away" and alternate crests are welded to the member 60 along the portion 67 of side section 65 that extends beyond section 66.

While cross member 80 is shown to extend in a wave pattern, it is understood that cross member 80 could also consist of generally straight sections that extend along members 60 and 70 in a "zig-zag" fashion.

In a preferred embodiment, cross member 80 is welded to members 60 and 70 such that an angle of between 30 and 60 degrees exists between cross member 80 and the vertical members, which are either rear members 60 or front members 70 at the point where cross member 80 is welded to the vertical members, either 60 or 70.

Figure 4:
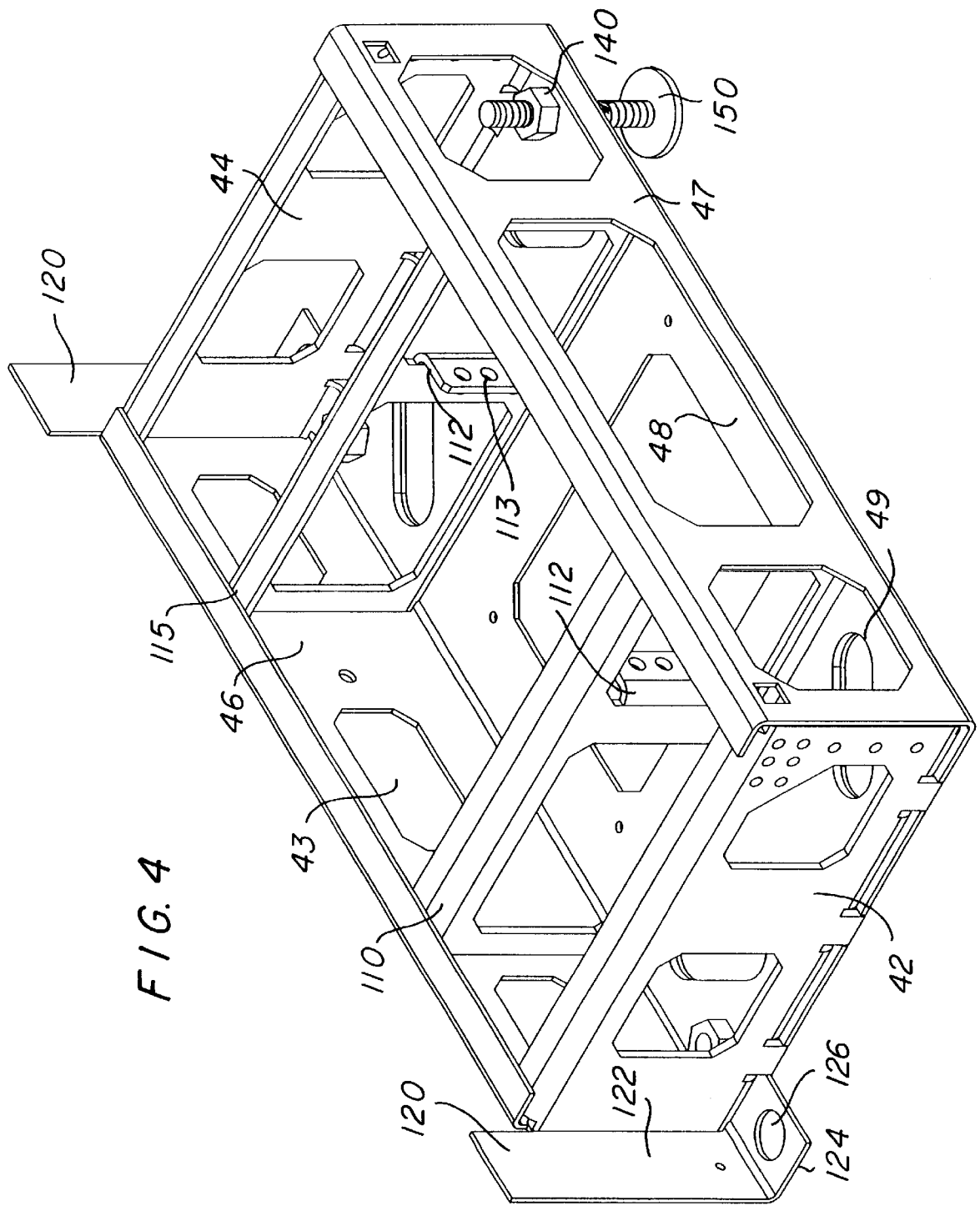
FIG. 4 is a perspective view, drawn to a larger scale, of the base of the telecommunications rack of FIG. 1.

As shown in FIG. 4, the base 40 is a sheet metal structure with sides 42 and 44, which are opposite and parallel to each other, a rear wall 46 and a front wall 47, which are also opposite and parallel to each other. A bottom 48 is attached at the lower edges of walls 46 and 47 and sides 42 and 44. The walls 46 and 47, sides 42 and 44, and bottom 48 of the base 40 are sheet metal with open areas, and connected to each other with welds. Rear and front walls 46 and 47 and bottom 48 are made from the same sheet of metal. These open areas, as illustrated by opening 43, allow weight to be removed from the base while maintaining its strength capability and they also permit airflow and cable passage in the base.

Figure 5:
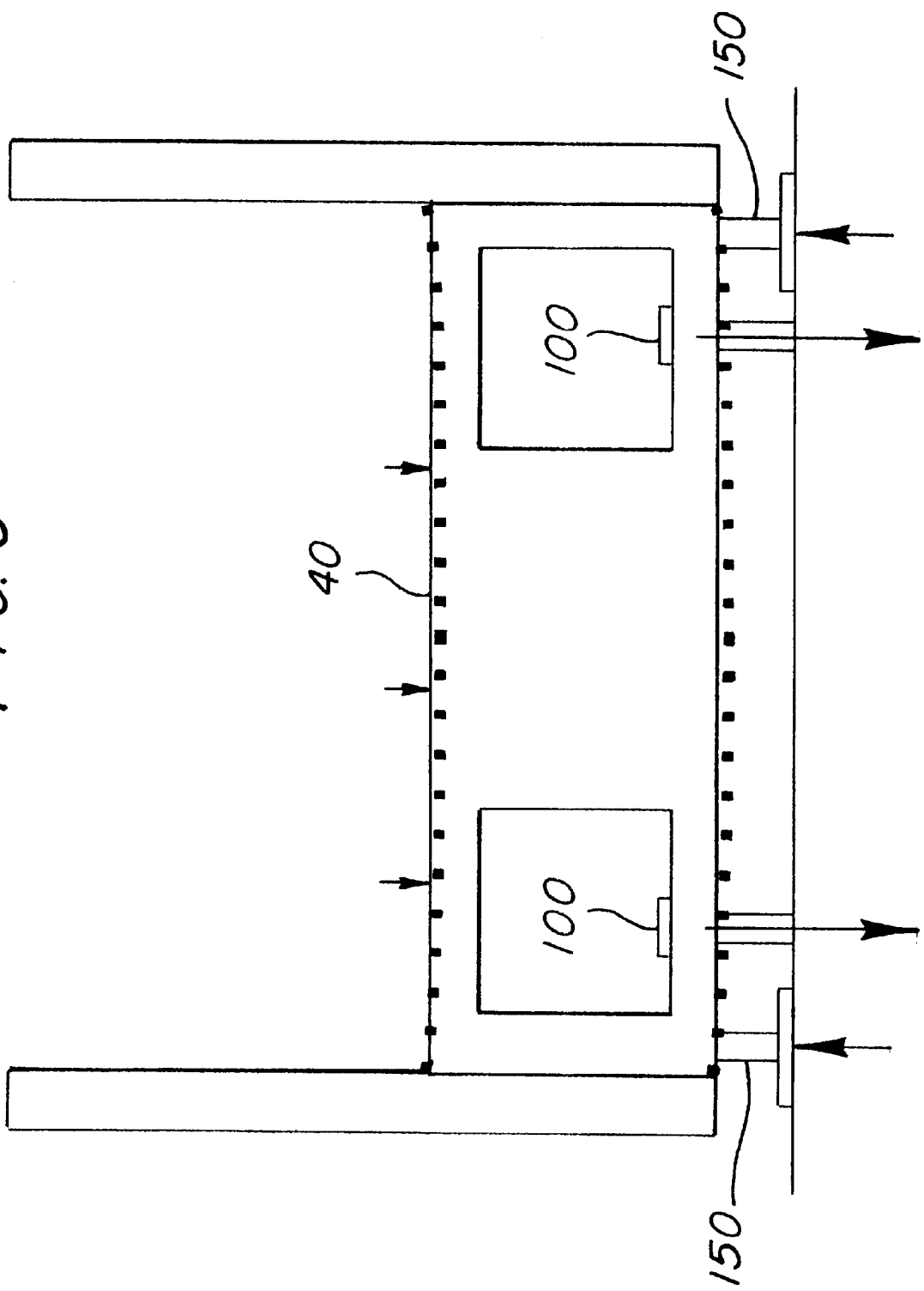
FIG. 5 is a schematic diagram illustrating the structural levelling of the telecommunications rack of FIG. 1 when mounted, creating a pre-stressed base.

The base 40 is mounted to the floor with bolts 100, shown in FIG. 5, or anchors which pass through four oblong slots 49 in the bottom and located respectively proximate the four corners of the base. Slots 49 permit positioning of bolts 100 to avoid reinforcement bars which may be embedded in concrete floors. The box structure of the base maximizes shear stiffness and still permits access inside the structure to adjust bolts 100.

Struts 110 and 115 extend between the rear and front walls 46 and 47 at spaced apart locations between the sides 42 and 44. Strut 110 is formed from the same sheet metal as side 42 and strut 115 is formed from the same sheet metal as side 44. These struts add support to the base, and are connected to the rear and front walls 46 and 47 with welds. Flanges 112 are located at the mid-section of struts 110 and 115. Flanges 112 extend perpendicularly from struts 110 and 115 and are preferably 25 mm wide by 60 mm long with holes 113 located vertically in the flanges, and are used for mounting a bracket for an AC power outlet. Alternatively, a bracket for a frame ground or a frame ground itself may be mounted to flanges 112. In a preferred embodiment, holes 113 are threaded holes.

Two flanges 120 extend from the base 40 at the location where the base 40 is attached, preferably by welds, to members 60 of upright supports 20 and 30. Flanges 120 are right angles, with section 122 in line with rear wall 46 and section 124 in line with bottom 48. Section 124 contains a hole 126 which is used in the manufacturing process for the rack. As shown in FIG. 1, members 70 of upright supports 20 and 30 are attached, preferably by welds, to base 40 along sides 42 and 44. Front members 70 are located approximately 100 mm from front 47. This location of members 70 is necessary to comply with ETSI and NEBS standards regarding the location where the shelves are mounted to the rack, and also permits cabling in the front of the rack without extending beyond the spatial envelope for the rack, which is also defined by ETSI and NEBS.

The base 40 has four adjustment feet 150 shown in FIGS. 4 and 5 one at each corner just outwardly of the respective oblong slots 49. Preferably, the adjustment feet are made of steel and are threaded into weld nuts 140. Weld nuts 140 are welded to the bottom 48 at the four corners outside the bolts and are threaded internally to accept adjustment feet 150. Adjustment feet 150 pass through the bottom 48 of base 40 to allow adjustment in height by rotating the feet. Preferably, adjustment feet 150 are adapted to receive an Allen Key to permit vertical adjustment of the rack by rotation of the adjustment feet.

Adjustment feet 150 should be strong enough to withstand seismic structural requirements. Preferably, adjustment feet 150 have a phenolic insular material which is 6.35 mm thick and attached to the bottom of the feet. This material helps insulate the telecommunications equipment to satisfy grounding requirements. As shown in FIG. 5., when bolts 100 or anchors are tightened by applying torque, the base 40 is pre-stressed to reduce initial base movement of the rack during vibration.

Shelves (not shown) are attached to upright supports 30 at locations between the top 50 and base 40. The shelving is made of structural steel, preferably 1.5 mm thick, and is attached to front members 70 of upright supports 30 along section 72 with thread forming screws. The shelves have flanges that extend along section 72 and have holes that may be aligned with holes 92 in section 72. The shelves are sufficiently stiff to be supported when mounted to member 70 only. Further, if the racks are joined in a back to back configuration, the shelves may be supported with either end fixed to the respective section 72 on each rack. Once the shelves are mounted, the rack is moved into position on the office floor, and levelled by rotating adjustment feet 150 as required. This permits one to level the rack without moving the equipment or shimming the loaded rack.

As illustrated in FIG. 5, in a preferred embodiment, base 40 is designed to be a pre-stressed member. This permits one to level the adjustment feet 150, then mount the rack to the floor with bolts 100. Bolts 100 pass through the bottom of the base and are tightened to a pre-determine torque level, thus deflecting the base by a calculated distance and placing the bolts 100 in tension. The pre-loaded structure lessens the effect of seismic loading since the pre-load must first be overcome before any structural deflections at the base occur due to seismic occurrences.

Numerous modifications, variations, and adaptations may be made to the particular embodiments of the invention described above without departing from the scope of the invention as defined in the claims.

We claim:

1. A telecommunications rack made of structural steel and comprising a base, a top and two open-structure sides extending between the base and the top, wherein each side comprises:
    a) two spaced substantially vertical members extending between and secured to the base and the top; and
    b) an elongate truss member having a generally zig-zag configuration defining spaced crests, the truss member being located between the two spaced members, with its crests welded to the two spaced members, and extending between the base and the top.

2. The telecommunications rack of claim 1 wherein the truss member is formed wire.

3. The telecommunications rack of claim 1 wherein the two spaced substantially vertical members comprise a front member and a rear member each having a profile and wherein the profile of the rear member projects further to the side than the profile of the front member thereby providing a front access space when two racks are side by side.

4. The telecommunications rack of claim 3 wherein the rear member is located substantially at a rear of the base and the front member is located rearward from a front of the base.

5. The telecommunications rack of claim 4 wherein the rear substantially vertical member is formed of a relatively wide channel structure and the front substantially vertical member is formed of a relatively narrow channel structure.

6. The telecommunications rack of claim 5 wherein the front substantially vertical member has an S-shaped cross-section.

7. The telecommunications rack of claim 5 wherein the rear substantially vertical member comprises two opposing members each having a C-shaped cross-section and the rear substantially vertical member has an S-shaped cross-section.

8. A telecommunications rack made of structural steel, comprising:
    a) a base;

b) a top;

c) two spaced substantially upright supports extending between and secured to the base and the top, each support having two spaced substantially vertical members made with sheet metal channels and comprising a first and a second substantially vertical member, the first substantially vertical member comprising two opposing members each having a C-shaped cross-section; and d) a truss member disposed between the substantially vertical members and secured thereto.

9. A telecommunications rack made of structural steel, comprising:

a) a base;

b) a top;

c) two spaced substantially upright supports extending between and secured to the base and the top, each support having two spaced substantially vertical members comprising a first and a second substantially vertical member, the first substantial vertical member comprising two opposing members each having a C-shaped cross-section and the second substantially vertical member having an S-shaped cross-section; and d) a truss member disposed between the substantially vertical members and secured thereto.

10. A telecommunications rack made of structural steel, comprising:

a) a base;

b) a top;

c) two spaced substantially upright supports extending between and secured to the base and the top, each support having two spaced substantially vertical members; and d) a truss member disposed between the substantially vertical members and secured thereto, wherein the truss member is an elongate member extending between the top and the base and having a configuration defining a plurality of spaced crests secured to the two substantially vertical members.

11. The telecommunications rack of claim 10 wherein the truss member is made of formed wire.

12. The telecommunications rack of claim 11 wherein the formed wire is welded to the vertical members.

13. A telecommunications rack made of structural steel, comprising:

a) a sheet metal base;

b) a top;

c) two spaced substantially upright supports extending between and secured to the base and the top, each support having a plurality of spaced substantially vertical members; and d) a truss member disposed between at least two of the substantially vertical members and secured thereto;

wherein the base is adapted for accepting adjustable feet proximate to the corners of the base and contains slots located in a bottom of the base and proximate to the corners of the base to permit attachment of the base to a floor and thereby pre-stress the base.

* * * * *